(12) United States Patent
Saito

(10) Patent No.: US 7,183,839 B2
(45) Date of Patent: Feb. 27, 2007

(54) DIODE DETECTING CIRCUIT

(75) Inventor: Shinji Saito, Akiruno (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 10/998,729

(22) Filed: Nov. 30, 2004

(65) Prior Publication Data

US 2006/0012422 A1    Jan. 19, 2006

(30) Foreign Application Priority Data

Jul. 13, 2004    (JP)    ............... 2004-206333

(51) Int. Cl.
*H03D 3/02*    (2006.01)

(52) U.S. Cl. ............. 329/331; 329/333; 329/335; 327/513; 330/289

(58) Field of Classification Search ............... 331/176; 330/289; 327/513; 329/331, 333, 335
See application file for complete search history.

(56) References Cited

U.S. PATENT DOCUMENTS 5,796,309 A * 8/1998 Nguyen .................. 330/289

\* cited by examiner

*Primary Examiner*—Arnold Kinkead

(74) *Attorney, Agent, or Firm*—Arent Fox PLLC

(57) ABSTRACT

A diode detecting circuit which cancels temperature dependence of a detecting diode so as to obtain highly sensitive detection. The diode detecting circuit has a first diode detecting unit in which a first diode detects an input signal biased by a bias voltage, a second diode detecting unit in which a second diode receives the bias voltage, and an output unit which compares an output from the first diode detecting unit with an output from the second diode detecting unit.

8 Claims, 8 Drawing Sheets

DIODE DETECTING CIRCUIT

This application claims priority from Japanese Patent Application Serial No. 2004-206333 of shinji SAITO filed Jul. 13, 2004. The entirety of that patent application is incorporated herein by reference.

BACKGROUND OF THE INVENTION

1. Field of the Invention

The present invention relates to a diode detecting circuit for detecting an electromagnetic wave signal.

2. Description of the Related Art

A radio communication apparatus for detecting an electromagnetic wave signal of a particular frequency use a receiving apparatus. In order to start the receiving operation, the receiving apparatus determines whether the radio signal of the particular frequency to be received exists. In recent years, such radio communication apparatuses are typically required to have the capability of detecting a faint radio signal. Moreover, a need has arisen to provide a detecting circuit for such apparatuses that has a higher sensitivity, but that is available at a low price and has low power consumption.

FIG. 1 is a circuit diagram illustrating a related art diode detecting circuit 10, of the half-wave rectifying type, for detecting a low level signal with high accuracy. The diode detecting circuit 10 of FIG. 1 has a capacitor 11, an inductor 12, a diode 13, a capacitor 14, a resistor 15, a constant voltage source 16, an input terminal 17 and an output terminal 18. An input voltage signal $V_{IN}$ is applied to the input terminal 17. The capacitor 11 shifts the input voltage signal $V_{IN}$ via capacitance coupling, and outputs an alternating input voltage signal $V_{AC}$ to node A. In addition, node A is coupled to a bias voltage $V_{OFFSET}$ of the constant voltage source 16 via an inductor 12. Due to the presence of the inductor 12, the voltage at node A varies freely in response to an applied high frequency voltage variation, whereas the voltage at node A is fixed at the bias voltage $V_{OFFSET}$ for low frequency voltage variation. Accordingly, the alternating input voltage signal $V_{AC}$ is biased by the bias voltage $V_{OFFSET}$ at node A, i.e., a diode input voltage signal $V_{DIN}$ which is applied to an anode terminal of the diode 13 equals the alternating input voltage signal $V_{AC}$ plus the bias voltage $V_{OFFSET}$.

As further shown in FIG. 1, when the diode input voltage signal $V_{DIN}$ exceeds the threshold voltage of the diode 13, a current signal $I_{DO}$ flows through the diode 13 in the forward direction, in accordance with the voltage of the diode input voltage signal $V_{DIN}$ at node A. Since the current signal $I_{DO}$ flows through the resistor 15 connected to a cathode terminal of the diode 13, the current signal $I_{DO}$ is converted to a voltage signal. In addition, this voltage signal is smoothed by the capacitor 14 connected in parallel to the resistor 15. Consequently, an output voltage $V_{OUT}$, which was smoothed by the capacitor 14, appears at the output terminal 18.

In the diode detecting circuit 10 of FIG. 1, the center voltage in the alternating diode input voltage signal $V_{DIN}$, which is applied to the anode terminal of the diode 13, can be set to a voltage near the threshold voltage of the diode 13 by adjusting the bias voltage $V_{OFFSET}$ of the constant voltage source 16. Accordingly, a low-level input voltage signal can be detected with high accuracy without the need to use an expensive diode having a low threshold voltage as the diode 13.

However, the threshold voltage of the diode 13 of FIG. 1 varies depending on temperature. Therefore, when temperature varies, the threshold voltage of diode 13 varies and deviates from the center voltage, which is typically set to the bias voltage $V_{OFFSET}$. In this situation, a low-level input voltage signal $V_{IN}$ cannot be detected with high accuracy.

FIG. 2 is a circuit diagram illustrating a diode detecting circuit 20, which is disclosed, for example, in Japanese Patent Application Publication No. 07-111421. The diode detecting circuit 20 of FIG. 2 eliminates the influence of temperature on circuit performance.

A diode detecting circuit 20 of FIG. 2 has a diode 21, a resistor 22, a differential amplifier 23, a feedback diode 24, and a resistor 25. An input voltage signal applied to an input terminal IN is rectified and detected by the diode 21 and resistor 22, and is then provided to a non-inverted input terminal (+) of the differential amplifier 23. An inverted input terminal (−) of the differential amplifier 23 is coupled with the ground potential via the resistor 25, and an output terminal of the differential amplifier 23 is coupled with the inverted input terminal (−) of the differential amplifier 23 through a feedback diode 24. The diode 21 and the feedback diode 24 have similar characteristics. Therefore, temperature dependence of the threshold voltage of the diode 21 that appears in the voltage signal supplied to the non-inverted input terminal (+) of the differential amplifier 23 is canceled by temperature dependence of the threshold voltage of the feedback diode 24 that appears in the signal supplied to the inverted input terminal (−) of the differential amplifier 23. Accordingly, the detection accuracy of the diode detecting circuit 20 of FIG. 2 is free from the influence of temperature effects on the diode 21.

However, the diode detecting circuit 20 of FIG. 2 has a problem in that bias voltages cannot be applied to the diodes 21 and 24. Namely, if a bias voltage is applied to the anode terminal of the diode 21, the same bias voltage should be applied to the anode terminal of the feedback diode 24 to compensate for the temperature dependence in the threshold voltage of the diode 21. In this situation, since the anode terminal of diode 24 is connected to the output terminal of the differential amplifier 23, current from a bias voltage source flows into the differential amplifier 23 through the output terminal of the differential amplifier 23, and an adequate bias voltage cannot be set. Accordingly, in the diode detecting circuit 20 of FIG. 2, bias voltages cannot be applied to the diodes 21 and 24. Therefore, expensive diodes having low threshold voltages must be used as the diodes 21 and 24, to allow detection of low-level input voltage signal with high accuracy.

Moreover, since it is generally difficult to form a diode having a low threshold voltage within an integrated circuit (IC) chip, individual diodes must be used to produce a diode detecting circuit using an IC chip.

There remains an unmet need in the related art to provide a diode detecting circuit which is stable under variation of temperature, without using an expensive diode having a low threshold voltage.

SUMMARY OF THE INVENTION

In order to attain the above advantage, as well as others, the present invention provides a diode detecting circuit suitably adapted to an apparatus which requires highly sensitive detection of an electromagnetic wave signal.

The diode detecting circuit in accordance with various embodiments of the present invention comprises a first diode detecting unit having a first diode, wherein the first unit detects an input signal biased by a bias voltage via said first diode, and outputs a detected signal; a second diode detecting unit having a second diode, wherein the second unit receives said bias voltage via said second diode, and outputs a reference detected signal; and an output unit which compares said detected signal and said reference detected signal, and outputs an output signal, the output signal being proportionate to a difference between said detected signal and said reference detected signal.

Additional advantages and novel features of the invention will be set forth in part in the description that follows, and in part will become more apparent to those skilled in the art upon examination of the following or upon learning by practice of the invention.

DESCRIPTION OF THE PREFERRED EMBODIMENTS

Embodiments of the present invention will be explained below with reference to the drawings. However, these embodiments are not intended to limit the technical scope of the present invention.

Figure 1:
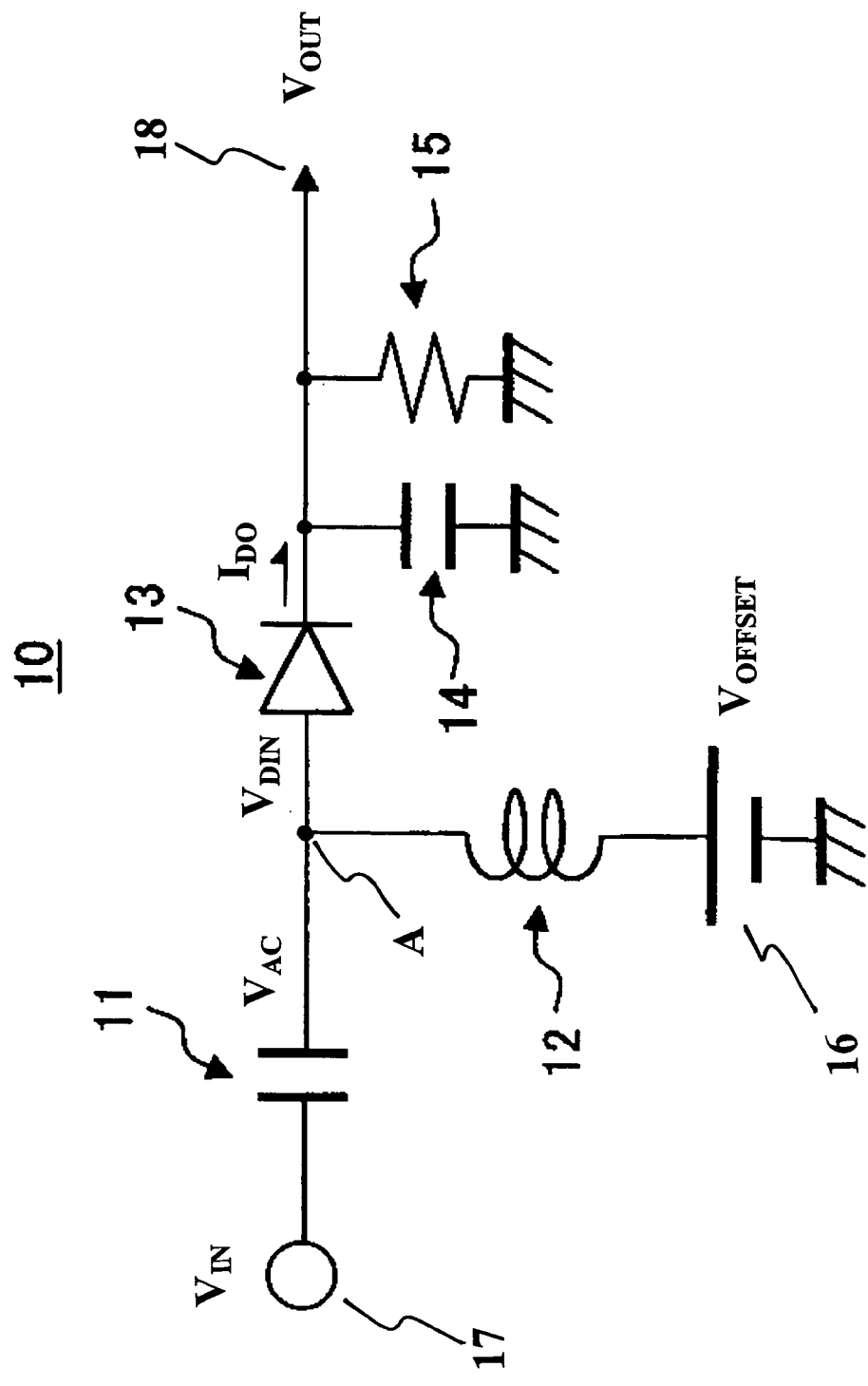
FIG. 1 shows a circuit diagram of a diode detecting circuit of the related art.
Figure 2:
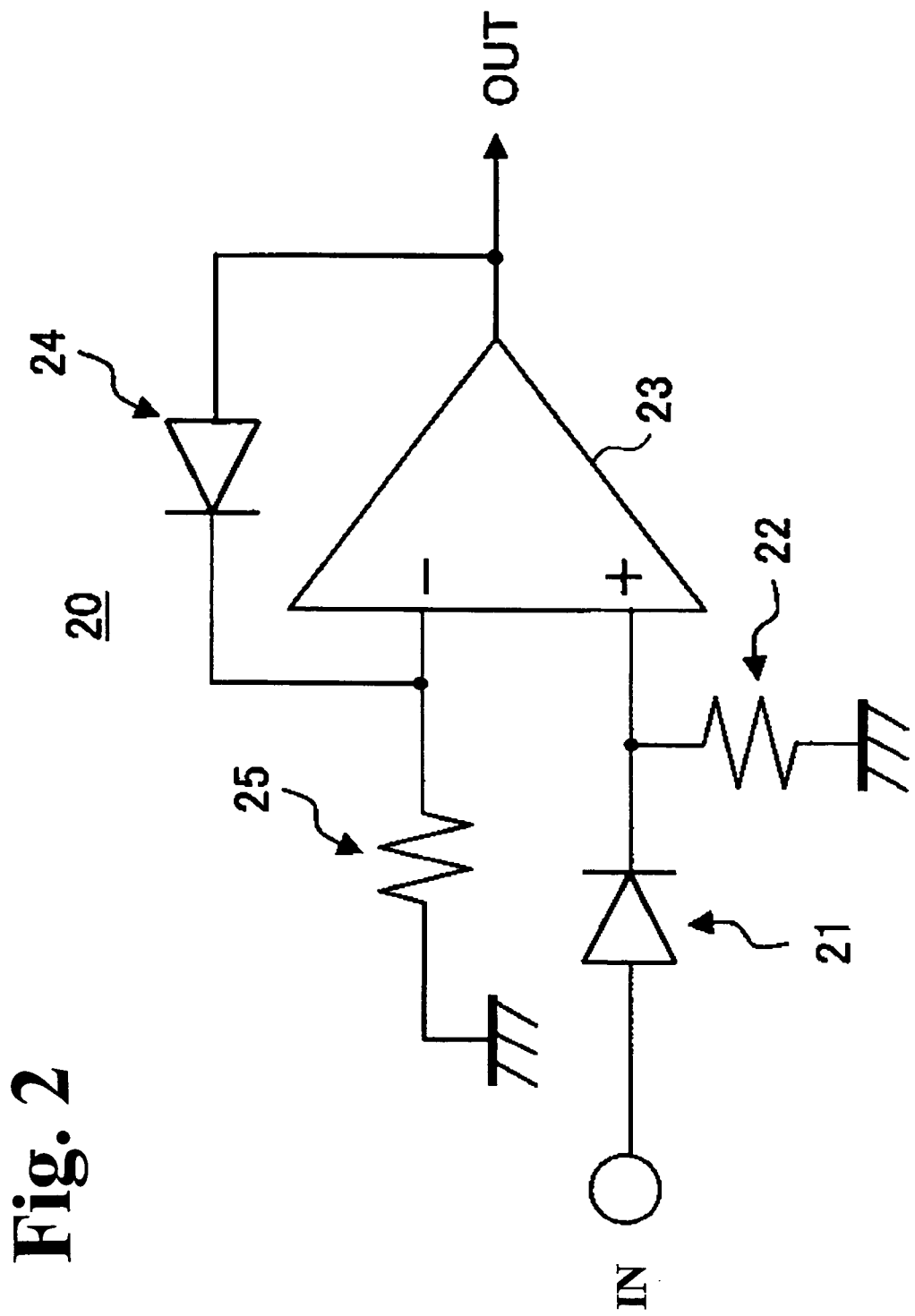
FIG. 2 shows another circuit diagram of a diode detecting circuit of the related art.
Figure 3:
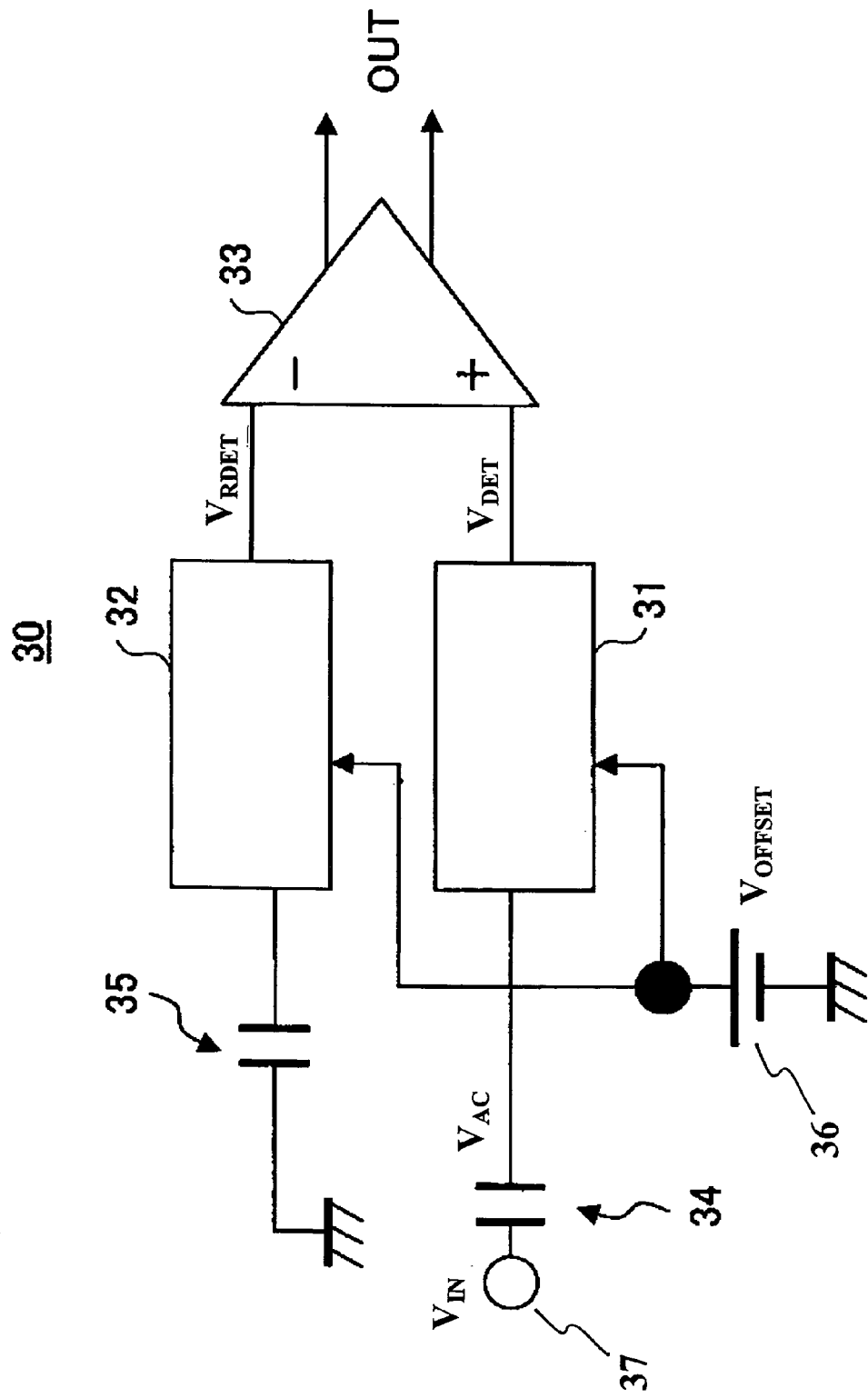
FIG. 3 shows a block diagram of a diode detecting circuit in accordance with an embodiment of the present invention.

FIG. 3 is a block diagram of a diode detecting circuit 30 in accordance with an embodiment of the present invention. The diode detecting circuit 30 of FIG. 3 has a first diode detecting unit 31, a second diode detecting unit 32, a differential amplifier 33, a first input capacitor 34, a second input capacitor 35, a constant voltage source 36, and an input terminal 37.

An input voltage signal $V_{IN}$ is applied to the input terminal 37. The first input capacitor 34 shifts the input voltage signal $V_{IN}$ via capacitance coupling, and supplies an alternating input voltage signal $V_{AC}$ to the first diode detecting unit 31. The first diode detecting unit 31 comprises a diode detector of, for example, a half-wave rectifying type, both-wave rectifying type, bridge rectifying type, or both-wave double voltage rectifying type. The first diode detecting unit 31 rectifies and detects the alternating input voltage signal $V_{AC}$, and supplies a detected voltage signal $V_{DET}$ to the non-inverted input terminal (+) of the differential amplifier 33.

As further shown in FIG. 3, the second diode detecting unit 32 receives a constant voltage (e.g., a ground voltage) via the second input capacitor 35. The second diode detecting unit 32, which has a structure and characteristics substantially equal or similar to those of the first diode detecting unit 31, supplies a reference detected voltage signal $V_{RDET}$ to the inverted input terminal (−) of the differential amplifier 33. The differential amplifier 33 provides a differential output signal OUT.

As further shown in FIG. 3, the first diode detecting unit 31 and the second diode detecting unit 32 are supplied with a bias voltage $V_{OFFSET}$ from a constant voltage source 36. The bias voltage $V_{OFFSET}$ is set in accordance with the threshold voltages of the diodes located within the first diode detecting unit 31 and the second diode detecting unit 32. Namely, the center voltage (see, e.g., FIG. 5 below) in the alternating variation of the input voltage signal is set to a voltage near the threshold voltage of the diodes by application of the bias voltage $V_{OFFSET}$. Accordingly, a low-level input voltage signal can be detected with high accuracy without using expensive diodes having low threshold voltages.

Moreover, as shown in FIG. 3, the differential amplifier 33 outputs the differential output signal OUT in accordance with a difference between the detected voltage signal $V_{DET}$ from the first diode detecting unit 31 and the reference detected voltage signal $V_{RDET}$ from the second diode detecting unit 32. Accordingly, temperature dependence of the first diode detecting circuit 31 is canceled by the differential amplifier 33, because the first diode detecting unit 31 and the second diode detecting unit 32 have equal or similar temperature dependences. Consequently, highly sensitive detection is obtained, since the temperature dependence of each diode is canceled.

Figure 4:
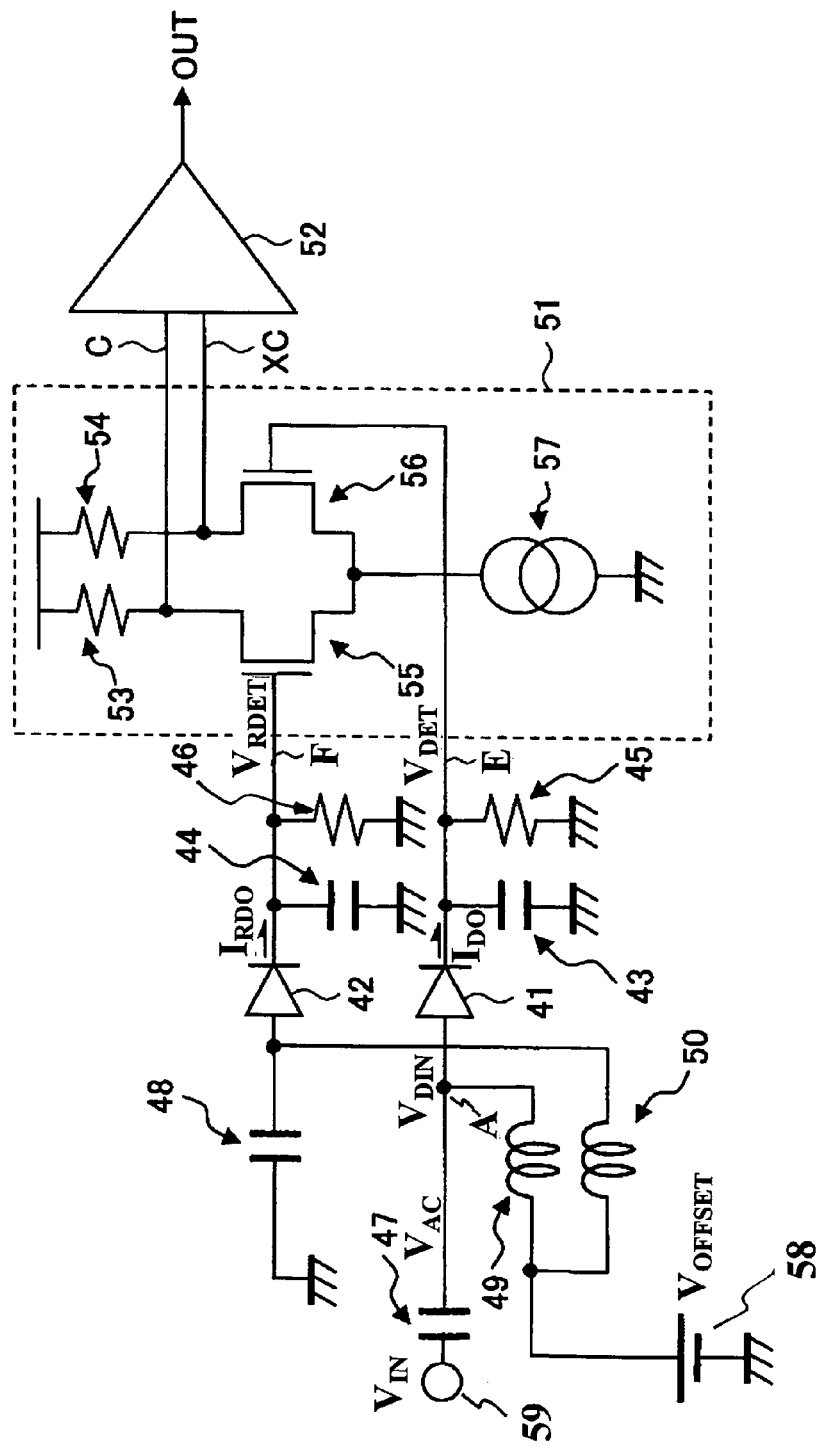
FIG. 4 shows a circuit diagram of a diode detecting circuit in accordance with an embodiment of the present invention.

FIG. 4 is a circuit diagram illustrating a diode detecting circuit 40 in accordance with an embodiment of the present invention. The diode detecting circuit 40 has a detecting diode 41, a reference detecting diode 42, a first smoothing capacitor 43, a second smoothing capacitor 44, a first resistor 45, a second resistor 46, a first input capacitor 47, a second input capacitor 48, a first inductor 49, a second inductor 50, a differential amplifier 51, a comparator 52, a constant voltage source 58, and an input terminal 59. The differential amplifier 51 includes load resistors 53 and 54, a first differential transistor 56, a second differential transistor 55, and a constant current source 57.

The detecting diode 41, the first smoothing capacitor 43, the first resistor 45 and the first inductor 49 of FIG. 4 constitute a half-wave rectifying type diode detector, which corresponds to the first diode detecting unit 31 of FIG. 3. The reference detecting diode 42, the second smoothing capacitor 44, the second resistor 46 and the second inductor 50 of FIG. 4 constitute another half-wave rectifying type diode detector, which corresponds to the second diode detecting unit 32 of FIG. 3.

As further shown in FIG. 4, an input voltage signal $V_{IN}$ is applied to the input terminal 59. The first input capacitor 47 shifts the input voltage signal $V_{IN}$ via capacitance coupling, and outputs an alternating input voltage signal $V_{AC}$ to node A. In addition, node A is coupled to a bias voltage $V_{OFFSET}$ of the constant voltage source 58 via the first inductor 49. Due to the presence of the inductor 49, the voltage at node A is varies freely in response to an applied high frequency voltage variation, whereas the voltage at node A is fixed at the bias voltage $V_{OFFSET}$ for low frequency voltage variation. Accordingly, the alternating input voltage signal $V_{AC}$ is biased by the bias voltage $V_{OFFSET}$ at node A, i.e., a diode input voltage signal $V_{DIN}$, which is applied to the anode terminal of the diode 13, equals the alternating input voltage signal $V_{AC}$ plus the bias voltage $V_{OFFSET}$.

As further shown in FIG. 4, when the voltage of the diode input voltage signal $V_{DIN}$ exceeds the threshold voltage of the detecting diode 41, a current signal $I_{DO}$ flows through the detecting diode 41 in the forward direction as indicated in FIG. 4, in accordance with voltage of the diode input voltage signal $V_{DIN}$. Since this current flows through the first resistor 45 connected to a cathode terminal of the detecting diode 41, the current signal is converted to a voltage signal. In addition, this voltage signal is smoothed by the first smoothing capacitor 43 connected in parallel to the first resistor 45. Consequently, a detected voltage signal $V_{DET}$, which was smoothed by the first smoothing capacitor 43, appears at node E and is supplied to the gate of the first differential transistor 56.

Figure 5:
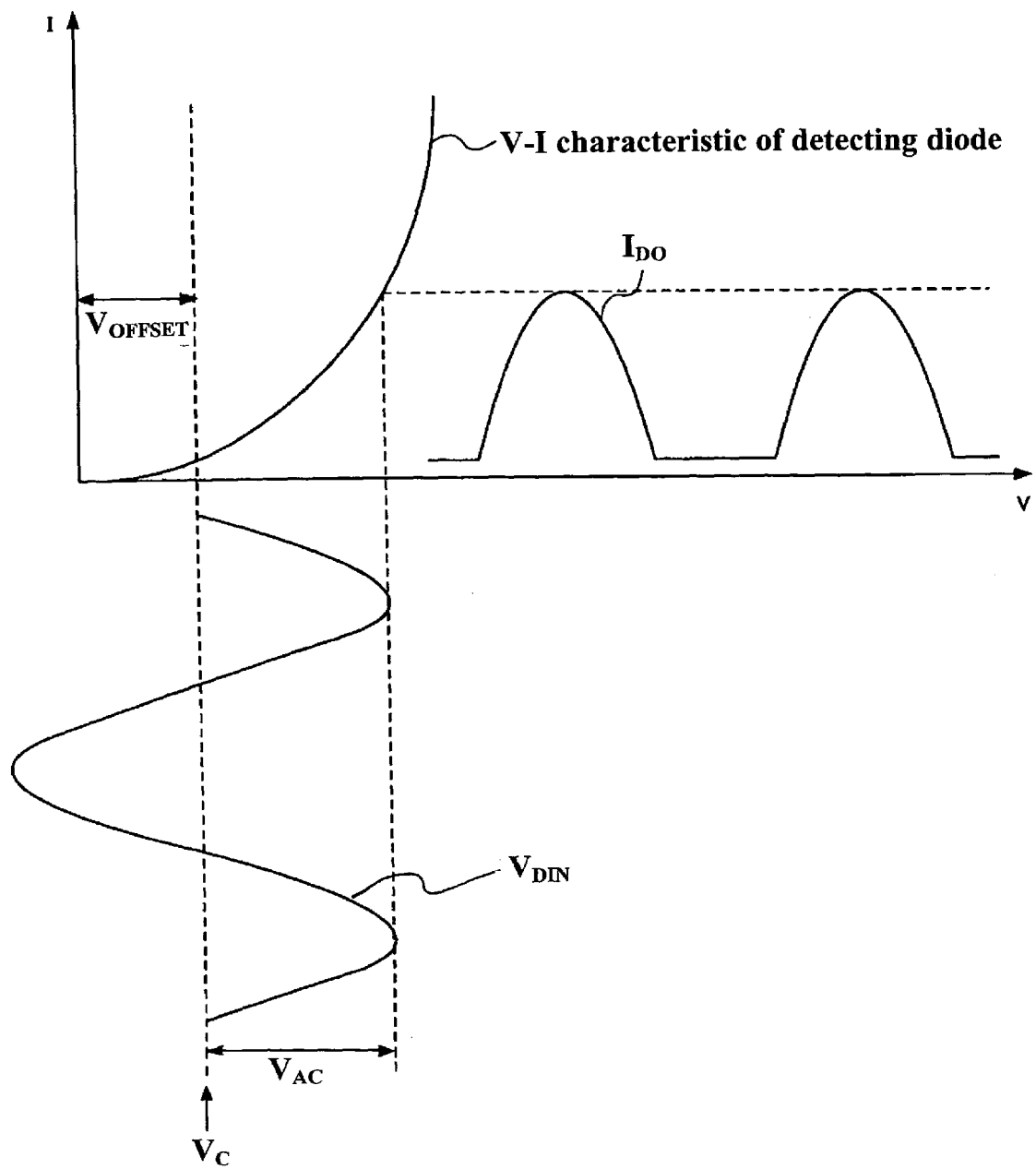
FIG. 5 is a waveform diagram of an input/output characteristic for a detecting diode in the diode detecting circuit of FIG. 4.

FIG. 5 is a waveform diagram of an input/output characteristic for the detecting diode 41 of FIG. 4. As illustrated in FIG. 5, the center voltage Vc in the alternating variation of the diode input voltage signal $V_{DIN}$ can be set to a voltage near the threshold voltage (i.e., a voltage at which the V-I characteristic curve starts to rise) of the detecting diode 41 in FIG. 4 by appropriately adjusting the bias voltage $V_{OFFSET}$ of the constant voltage source 58 of FIG. 4. As a result, voltage variation of the diode input voltage signal $V_{DIN}$ in a voltage range higher than the center voltage Vc can accurately be detected as the current signal $I_{DO}$ by the detecting diode 41. Thus, the current signal $I_{DO}$, which has a large amplitude, can be obtained.

As further shown in FIG. 4, the second input capacitance 48 has an applied constant voltage (e.g., a ground voltage; the constant voltage which is applied to the second input capacitance 48 is not limited to the ground voltage). An anode terminal of the reference detected diode 42 is coupled to the bias voltage $V_{OFFSET}$ of the constant voltage source 58 via the inductor 50, in the same manner as an anode terminal of the detecting diode 41 is coupled to the bias voltage $V_{OFFSET}$ Of the constant voltage source 58 via the inductor 49. Since the voltage of the anode terminal of the reference detecting diode 42 is fixed to the bias voltage $V_{OFFSET}$, a small amount of bias current $I_{RDO}$ flows through the reference detecting diode 42 in the forward direction as indicated in FIG. 4. Since the bias current $I_{RDO}$ flows through the second resistor 46, which is connected to the reference detecting diode 42, the bias current $I_{RDO}$ is converted to a reference detected voltage signal $V_{RDET}$. The reference detected voltage signal $V_{RDET}$ is supplied to the gate of the second differential transistor 55.

As further shown in FIG. 4, the differential amplifier 51 supplies a first differential output signal C and a second differential output signal XC to the comparator 52. The comparator 52 compares the first differential output signal C and the second differential output signal XC, and outputs an output signal OUT in accordance with the comparison result.

As described above, in the diode detection circuit of FIG. 4, the differential amplifier 51 outputs the first differential output signal C and the second differential output signal XC in accordance with the difference between the detected voltage signal $V_{DET}$ and the reference detected voltage signal $V_{RDET}$. Accordingly, the differential amplifier 51 cancels any temperature dependence of the detecting diode 41, because the temperature dependence of the detected voltage signal $V_{DET}$ (due to the temperature dependence of the detecting diode 41) is equal or similar to the temperature dependence of the reference detected voltage signal $V_{RDET}$ (due to the temperature dependence of the reference detecting diode 42). Consequently, highly sensitive detection (in which a temperature dependence of the detecting diode 41 is canceled) is provided.

Figure 6:
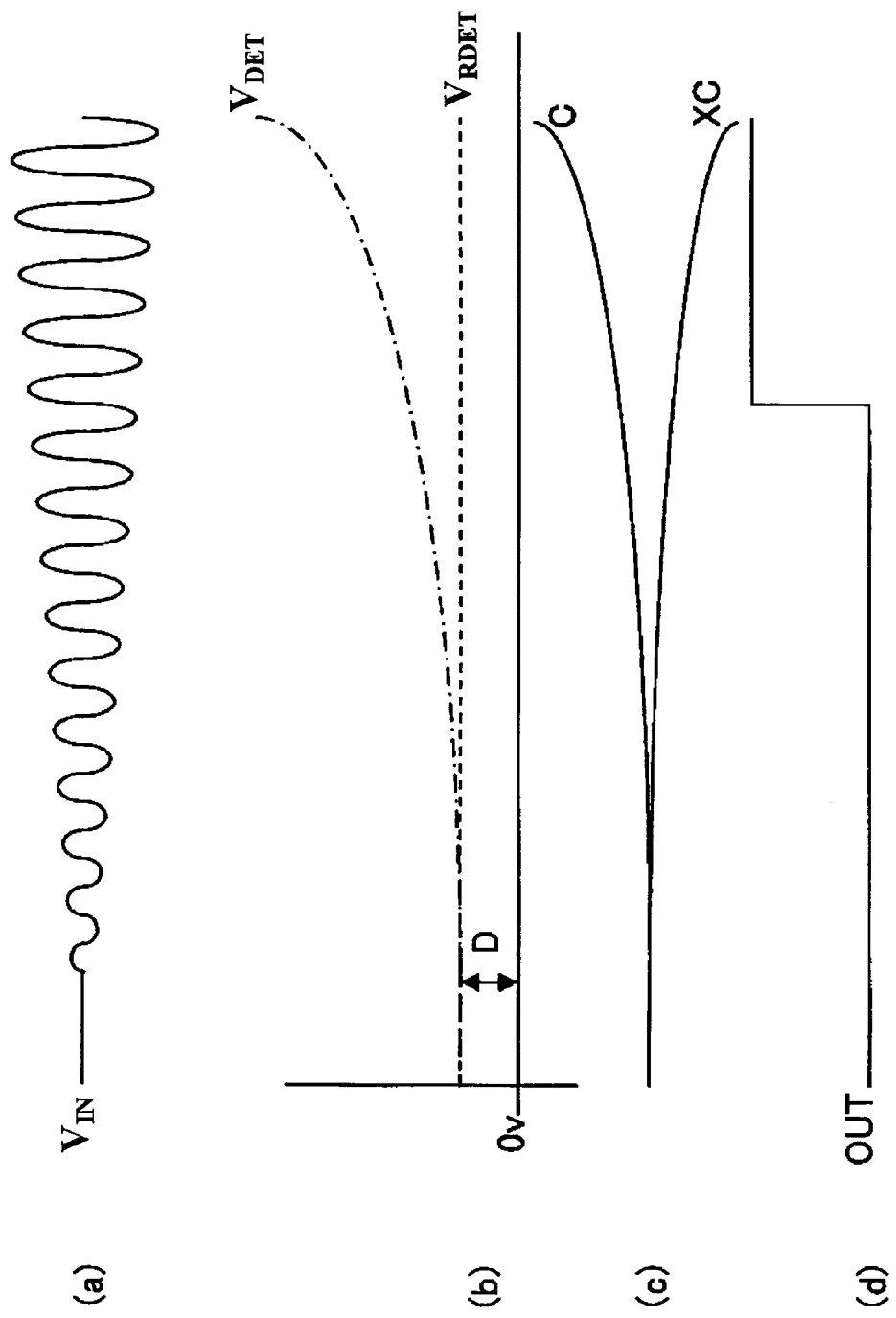
FIG. 6 is a waveform diagram for several nodes in the diode detecting circuit of FIG. 4.

FIG. 6 is a waveform diagram at several nodes in the diode detecting circuit 40 of FIG. 4, which reflects the effect of canceling temperature dependence. Waveform (a) of FIG. 6 shows an example of the input voltage signal $V_{IN}$, which is applied to the input terminal 59 of FIG. 4. Waveform (b) of FIG. 6 shows voltage variations of the detected voltage signal $V_{DET}$ at node E of FIG. 4 and the reference detected voltage signal $V_{RDET}$ at node F of FIG. 4. When the amplitude of the input voltage signal $V_{IN}$ becomes large, the voltage of the detected voltage signal $V_{DET}$ increases, whereas the voltage of the reference detected voltage signal $V_{RDET}$ remains constant value. If the threshold voltage of the detecting diode 41 and the reference detecting diode 42 of FIG. 4 varies due to temperature dependence, a base voltage D, indicated in the waveform (b) of FIG. 6, of the detected voltage signal $V_{DET}$ and the reference detected voltage signal $V_{RDET}$ correspondingly varies. The change of the base voltage D is identical in the detected voltage signal $V_{DET}$ and the reference detected voltage signal $V_{RDET}$. Namely, the base voltage D of the detected voltage signal $V_{DET}$ is always identical to the base voltage D of the reference detected voltage signal $V_{RDET}$ because the temperature dependence of the detecting diode 41 of FIG. 4 is equal or similar to that of the reference detecting diode 42 of FIG. 4.

Waveform (c) of FIG. 6 shows voltage variations of a first differential output signal C and a second differential output signal XC from the differential amplifier 51 of FIG. 4. The differential amplifier 51 of FIG. 4 amplifies the difference between the detected voltage signal $V_{DET}$ and the reference detected voltage signal $V_{RDET}$, and outputs a pair of differential signals (i.e., a first differential output signal C and a second differential output signal XC). Thus, the base voltage D of the detected voltage signal $V_{DET}$, illustrated in the waveform (b) of FIG. 6, and the reference detected voltage signal $V_{RDET}$ cancels one another via a differential voltage amplifying operation in the differential amplifier 51 of FIG. 4. Accordingly, the first differential output signal C and the second differential output signal XC in waveform (c) of FIG. 6 are not affected by change in the base voltage D due, for example, to temperature dependence of the detecting diode 41 of FIG. 4. Waveform (d) of FIG. 6 shows an output signal OUT of the comparator 52 of FIG. 4. The comparator 52 changes the output signal OUT to a HIGH level when a difference between the first differential output signal C and the second differential output signal XC of waveform (c) exceeds a predetermined value.

As described above, in the diode detecting circuit 40 of FIG. 4, a low level signal can be detected to higher accuracy by applying the bias voltage $V_{OFFSET}$ to the anode terminal of the detecting diode 41, without using an expensive diode having a low threshold voltage as the detecting diode 41. Moreover, temperature dependence of the detecting diode 41 can be canceled by the differential operation of the differential amplifier 51, which is supplied with the detected voltage signal $V_{DET}$ from the detecting diode 41 and the reference detected voltage signal $V_{RDET}$ from the reference detecting diode 42. Consequently, highly sensitive detection, in which any temperature dependence of detecting diode 41 is counteracted, is realized.

Figure 7:
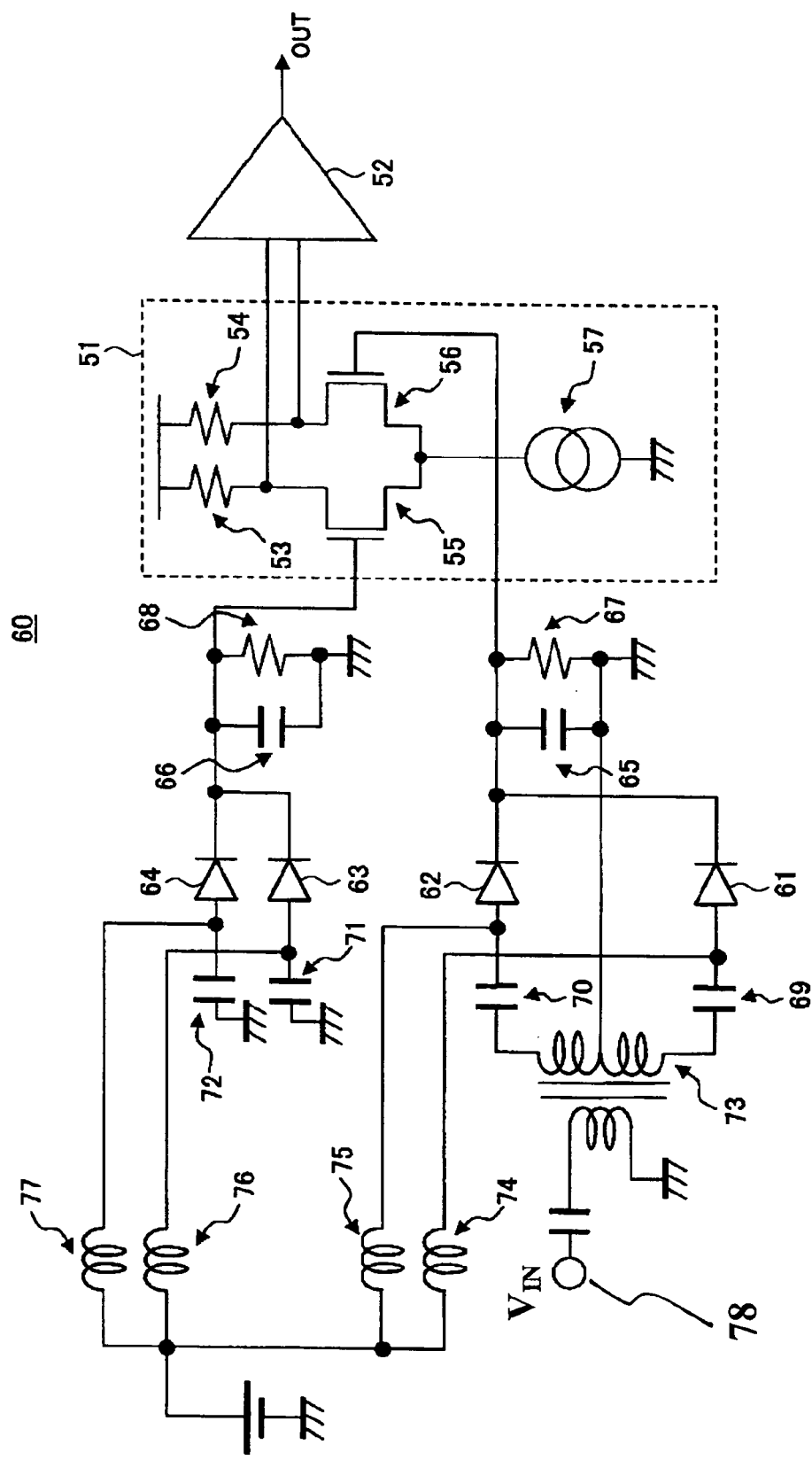
FIG. 7 shows another circuit diagram of a diode detecting circuit in accordance with an embodiment of the present invention.

FIG. 7 shows a circuit diagram of a diode detecting circuit 60 in accordance with another embodiment of the present invention. In the diode detecting circuit 60 of FIG. 7, detecting diodes 61 and 62, a first smoothing capacitor 65, a first resistor 67, and first inductors 74 and 75 constitute a both-wave rectifying type diode detector, which corresponds to the first diode detecting unit 31 of FIG. 3. Similarly, reference detecting diodes 63 and 64, a second smoothing capacitor 66, a second resistor 68, and second inductors 76 and 77 constitute another both-wave rectifying type diode detector, which corresponds to the second diode detecting unit 32 of FIG. 3.

As further shown in FIG. 7, an input voltage signal $V_{IN}$ is applied to the input terminal 78. The input voltage signal $V_{IN}$ is converted into a signal having forward polarity and a signal having backward polarity by a transformer 73. The forward polarity and backward polarity signals are respectively shifted by first input capacitors 69 and 70, and are applied to the detecting diodes 61 and 62 in the forward direction, as indicated in FIG. 7. The detecting diodes 61 and 62 perform half-wave rectification of the forward polarity and backward polarity signals, respectively. Thus, both-wave rectification of the input voltage signal $V_{IN}$ is realized. In the diode detecting circuit 60 of FIG. 7, temperature dependence of the detecting diodes 61 and 62 is canceled by use of two reference detecting diodes 63 and 64, similarly to how the diode detecting circuit 40 of FIG. 4 operates.

As described above, the present invention can also be applied not only to a diode detecting circuit of half-wave rectifying type as shown in FIG. 4, but also to a diode detecting circuit of the both-wave rectifying type, as shown in FIG. 7. Moreover, it is apparent that the present invention can also be adapted to diode detecting circuits of the bridge rectifying type and of the both-wave double-voltage rectifying type.

Figure 8:
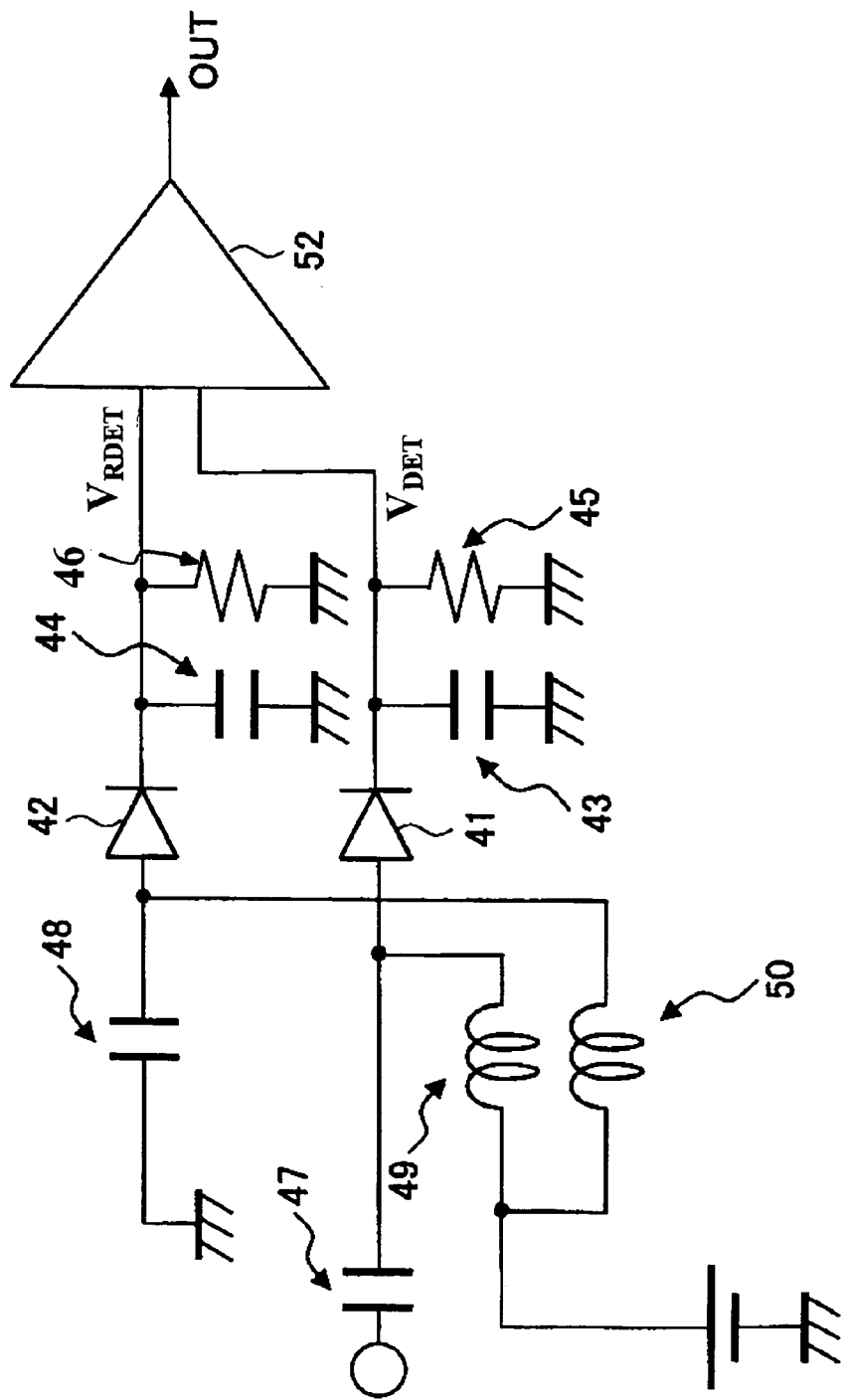
FIG. 8 shows another circuit diagram of a diode detecting circuit in accordance with an embodiment of the present invention.

FIG. 8 shows a circuit diagram of a diode detecting circuit 40A in accordance with another embodiment of the present invention. The diode detecting circuit 40A of FIG. 8 is a modification of the diode detecting circuit 40 of FIG. 4.

In the diode detecting circuit 40A of FIG. 8, a detected voltage signal $V_{DET}$ from a detecting diode 41 and a reference detected voltage signal $V_{RDET}$ from a reference detecting diode 42 are supplied to a comparator 52. The comparator 52 compares the detected voltage signal $V_{DET}$ with the reference detected voltage signal $V_{RDET}$, and changes the output signal OUT to a HIGH level when a difference between the detected voltage signal $V_{DET}$ and the reference detected voltage signal $V_{RDET}$ exceeds a predetermined value. Accordingly, temperature dependence of the detecting diode 41 is canceled by the comparison operation of the comparator 52, which is supplied with the detected voltage signal $V_{DET}$ from the detecting diode 41 and the reference detected voltage signal $V_{RDET}$ from the reference detecting diode 42.

The above-described preferred embodiments of the present invention propose a structure in which the forward voltage variation of the input voltage signal is detected with diode detecting circuits. However, the present invention can also be adapted to a structure in which the voltage variation in the backward direction (negative direction) of the input voltage signal is detected. In addition, the present invention can be applied to a structure in which the voltage variation in both the forward direction and the backward direction can be detected.

Example embodiments of the present invention have now been described in accordance with the above advantages. It will be appreciated that these examples are merely illustrative of the invention. Many variations and modifications will be apparent to those skilled in the art.

What is claimed is:

1. A diode detecting circuit, comprising:
   a first diode detecting unit having a first diode, wherein the first unit detects an input signal biased by a bias voltage via said first diode, and outputs a detected signal;
   a second diode detecting unit having a second diode, wherein the second unit receives said bias voltage via said second diode, and outputs a reference detected signal; and
   an output unit which compares said detected signal and said reference detected signal, and outputs an output signal, the output signal being proportionate to a difference between said detected signal and said reference detected signal, further wherein said first diode detecting unit and second diode detecting unit have equivalent operating characteristics, and wherein the bias voltage is adjustable.

2. The diode detecting circuit according to claim 1, wherein said output unit comprises a differential amplifier which receives said detected signal and said reference detected signal.

3. The diode detecting circuit according to claim 2, wherein said output unit further comprises a comparator which receives a pair of differential signals from said differential amplifier, and outputs said output signal.

4. The diode detecting circuit according to claim 1, wherein said output unit comprises a comparator which receives said detected signal and said reference detected signal, and outputs said output signal.

5. The diode detecting circuit according to claim 1, wherein said first diode detecting unit and said second diode detecting unit are each selected from a group consisting of a half-wave rectifying type diode detector and a both-wave rectifying type diode detector.

6. A diode detecting circuit comprising:
   a first diode detecting unit having a first diode, wherein the first unit detects an input signal biased by a bias voltage via said first diode, and outputs a detected signal;
   a second diode detecting unit having a second diode, wherein the second unit receives said bias voltage via said second diode, and outputs a reference detected signal; and
   an output unit which compares said detected signal and said reference detected signal, and outputs an output signal, the output signal being proportionate to a difference between said detected signal and said reference detected signal, and
   wherein said first diode detecting unit further comprises:
   a first inductor through which said bias voltage is applied to an anode terminal of said first diode; and
   a first resistor and a first capacitor connected in parallel to a cathode terminal of said first diode; and
   wherein said second diode detecting unit further comprises:
   a second inductor through which said bias voltage is applied to an anode terminal of said second diode; and
   a second resistor and a second capacitor connected in parallel to a cathode terminal of said second diode.

7. The diode detecting circuit according to claim 6, wherein said bias voltage is approximately equal to threshold voltages of said first and second diodes.

8. The diode detecting circuit according to claim 6, wherein said first diode and said second diode have equivalent operating characteristics.

* * * * *